United States Patent [19]
Ghezzo et al.

[11] Patent Number: 6,067,931
[45] Date of Patent: May 30, 2000

[54] THERMAL PROCESSOR FOR SEMICONDUCTOR WAFERS

[75] Inventors: Mario Ghezzo, Ballston Lake, N.Y.; Timothy Dietrich Page, Cleveland, Ohio; Thomas Bert Gorczyca, Schenectady, N.Y.; Rolf Sverre Bergman, Cleveland Hts., Ohio; Himanshu Bachubhai Vakil, Schenectady, N.Y.; Charles Samuel Huey, Willoughby, Ohio; Seth David Silverstein, Schenectady, N.Y.

[73] Assignee: General Electric Company, Schenectady, N.Y.

[21] Appl. No.: 08/743,587

[22] Filed: Nov. 4, 1996

[51] Int. Cl.⁷ ............................... C23C 16/00; F27D 1/00
[52] U.S. Cl. .................... 118/725; 118/724; 392/411; 392/416; 219/385; 219/405
[58] Field of Search .................... 118/724, 725; 392/411, 416; 219/385, 405, 411

[56] References Cited

U.S. PATENT DOCUMENTS

| | | | |
|---|---|---|---|
| 3,372,672 | 3/1968 | Wright et al. | 118/724 |
| 3,665,139 | 5/1972 | Steggewentz | 219/10.43 |
| 4,160,929 | 7/1979 | Thorington et al. | 313/112 |
| 4,409,512 | 10/1983 | Walsh | 313/113 |
| 4,435,445 | 3/1984 | Allred et al. | 427/54.1 |
| 4,496,609 | 1/1985 | McNeilly et al. | 427/55 |
| 4,579,080 | 4/1986 | Martin et al. | 118/500 |
| 4,653,428 | 3/1987 | Wilson et al. | 118/725 |
| 4,654,509 | 3/1987 | Robinson et al. | 219/405 |
| 4,938,815 | 7/1990 | McNeilly | 156/612 |
| 5,433,791 | 7/1995 | Brewer et al. | 118/724 |
| 5,636,320 | 6/1997 | Yu et al. | 392/416 |
| 5,715,361 | 2/1998 | Moslehi | 392/416 |
| 5,781,693 | 7/1998 | Ballance et al. | 392/416 |
| 5,862,302 | 1/1999 | Okase | 392/416 |

FOREIGN PATENT DOCUMENTS

| | | |
|---|---|---|
| 4026728A1 | 2/1992 | Germany . |
| 59-94829 | 5/1984 | Japan . |
| 60-74425 | 4/1985 | Japan . |
| 61-1017 | 1/1986 | Japan . |
| 61-129834 | 6/1986 | Japan . |
| 4074-859 | 3/1992 | Japan . |
| 07029844 | 1/1995 | Japan . |
| 072452374 | 9/1995 | Japan . |

OTHER PUBLICATIONS

Grant, Julius, Hackh's Chemical Dictionary, p. 346, 1969.

Besancon, Robert M., The Encyclopedia of Physics, Third Edition, pp. 588–591, Oct. 1991.

"Effect of Infrared Transparency on the Heat Transfer Through Windows: A Clarification of the Greenhouse Effect," SD Silverstein, Science, vol. 193, Jul. 16, 1976.

"Antimony–Doped Tin Oxide Films Deposited by the Oxidation of Tetramethyltin and Trimethylantimony," TP Chow; M. Ghezzo, BJ Baliga, J. Electrochem. Soc.: Solid–State Science and Technology, May 1982, pp. 1040–1045.

(List continued on next page.)

*Primary Examiner*—Jeffrie R Lund
*Attorney, Agent, or Firm*—Ann M. Agosti; Jill M. Breedlove

[57] ABSTRACT

A thermal processor for at least one semiconductor wafer includes a reactor chamber having a material substantially transparent to light including a wavelength within the range of about 200 nanometers to about 800 nanometers for holding the at least one semiconductor wafer. A coating including a material substantially reflective of infrared radiation can be present on at least a portion of the reactor chamber. A light source provides radiant energy to the at least one semiconductor wafer through the coating and the reactor chamber. The light source can include an ultraviolet discharge lamp, a halogen infrared incandescent lamp, or a metal halide visible discharge lamp. The coating can be situated on an inner or outer surface of the reactor chamber. If the reactor chamber has inner and outer walls, the coating can be situated on either the inner wall or the outer wall.

21 Claims, 3 Drawing Sheets

OTHER PUBLICATIONS

"Temperature Measurement in a Furnace–Heated RTP System," Chunghsin Lee, Solid–State Technology, Apr. 1993.

"A Continuous Heat Source—Rapid Thermal Processor," C. Lee, AB Wittkower, Semiconductor Fabtech 94.

Spectral Emissivity of Silicon, Tsutomu Sato, The Research Institute for Scientific Measurements, Tohoku University, Gojyo–Dori, Sendai, Nov. 2, 1966, pp. 339–347.

"Emissivity of Silicon at Elevated Temperatures," PJ Timans, J. Applied Phys. 74 (10) Nov. 15, 1993, pp. 6353–6364.

"The Effect of Multilayer Patterns on Temperature Uniformity During Rapid Thermal Processing," Jeffrey P. Hebb, Klavs F. Jensen, J. Electrochem. Soc., vol. 143, No. 3, Mar. 1996, pp. 1142–1151.

"Rapid Thermal Processing Systems," Ronald E. Sheets, Microelectronic Manufacturing and Testing, Jul. 1985, pp. 16–18.

"Optical Properties of Tin–Doped Indium Oxide Determined by Spectroscopic Ellipsometry," Tobias Gerfin, Michael Gratzel, J. Applied Phys. 79 (3) Feb. 1, 1996, pp. 1722–1729.

"Equipment Performance Issues in Rapid Thermal Processing," Walter Thurston, Richard Seaman, Microelectronic Manufacturing and Testing, Jul. 1985.

THERMAL PROCESSOR FOR SEMICONDUCTOR WAFERS

BACKGROUND OF THE INVENTION

Silicon wafers have traditionally been processed in stages such as deposition, oxidation, and etching, for example, in batches of twenty to forty wafers at a time. The batches are processed inside quartz tubes wherein the wafers are held separately on quartz "wafer carriers". The tubes and wafers are heated by furnaces to a temperature ranging from about 800° C. to about 1200° C. Typically these furnaces are resistance heated furnace structures, such as furnaces heated with electric metal coils, and have processing times of several hours.

Single wafer processes have recently been developed. Instead of long tubes with wafer carriers, smaller chambers are used, and the time for processing one wafer can be on the order of one minute. One of the most prevalent single wafer processes uses a quartz chamber and is referred to as a rapid thermal process (RTP). RTP and other similar single wafer processes still heat the wafers from about 1000° C. to 1200° C.; however, tungsten halogen lamps are used instead of resistive heating. Some batch processes likewise use tungsten halogen lamps instead of resistive heating. Such processes are generally referred to as "fast batch processes" because they require more time than single wafer processes but less time than traditional batch processes.

Conventional RTP systems for semiconductor manufacturing use the tungsten halogen lamps to rapidly heat single silicon wafers laying horizontally within quartz parallel-plate reactors. In such systems, efficiency is compromised because the spectral emittance of tungsten lamps is skewed toward the infrared region (where silicon absorption is low) and because the heat irradiated by the hot silicon surfaces is transmitted through the reactor walls and lost outside the reactor. In addition to requiring a large amount of electric power for the above reasons, heating variations across the wafers are caused by the relative position of the wafers with respect to the lamps.

SUMMARY OF THE INVENTION

It would be desirable to have a thermal processor for semiconductor wafers with higher power efficiency (and correspondingly longer lamp life and lower energy consumption) than conventional processors.

It would also be desirable to have a thermal processor for semiconductor wafers with improved heating uniformity over conventional processors and thereby achieve a uniform surface temperature.

In one embodiment of the present invention, efficiency is increased by coating walls of a transparent reactor with a wavelength-selective layer to allow ultraviolet (UV) and visible radiation from the lamps to enter into the reactor while blocking the exit of infrared radiation emitted from the hot semiconductor wafers. Trapping the radiation within the reactor will increase the process efficiency by requiring less incident radiation onto the chamber and improve heating uniformity by increasing the fraction of indirect radiation that is insensitive to the lamp position.

In another embodiment, a halogen infrared incandescent lamp or a shorter wavelength mercury or metal halide discharge lamp is used which requires less power than a tungsten lamp because it emits at a wavelength of higher silicon absorption. This lamp is also more reliable because a tungsten filament is not present.

These two embodiments can be used individually or in combination in thermal processes such as single wafer processes, batch processes, rapid thermal processes, and fast batch processes, for example.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
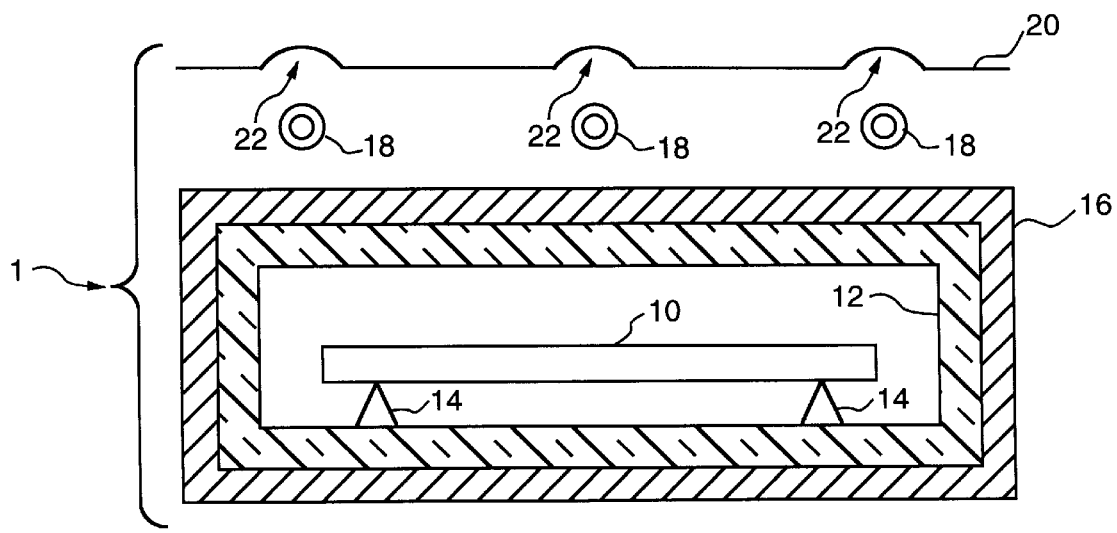
FIG. 1 is a sectional side view of a thermal processor embodiment of the present invention.

FIG. 1 is a sectional side view of a thermal processor embodiment 1 of the present invention. A semiconductor wafer 10 is positioned in a reactor chamber 12 and supported by small pins 14. The chamber has a wavelength selective coating 16 and receives radiant energy from lamp heating elements 18 and a lamp reflector 20.

Wafer 10 may comprise any of a number of semiconductor materials such as silicon, silicon carbide, gallium arsenide, gallium nitride, for example. If desired, these semiconductor materials can be in combination with thin insulators and/or metal layers. Chamber 12 may comprise a material that is sufficiently optically transparent to permit high transmission of ultraviolet light and/or visible light (light including a wavelength within the range of about 200 nanometers to about 800 nanometers). Examples of material for chamber 12 include quartz, quartz doped with alumina, alumina, and synthetic silica.

In the embodiment of FIG. 1, the wafer 10 is laid horizontally inside the chamber and is supported by pins 14 comprising quartz with the device surface facing the opposite side of the chamber (the non-pin side) and the lamp heating elements. The positioning of the wafer in the chamber is not critical. For example, the wafer can be supported in a slanted or vertical position or be supported by a quartz pedestal on the middle of the reactor chamber.

Coating 16 can be selected from any of a number of wavelength-selective materials that reflect infrared light such as, for example, indium-tin-oxide (ITO), antimony-tin-oxide (ATO), fluorine-tin-oxide (FTO), undoped tin oxide, dichroic filters, or thin metal films such as silver, aluminum, or gold. Dichroic filters may be fabricated of a stack of titanium oxide and silicon dioxide layers or tantalum oxide and silicon dioxide layers, for example, and are advantageous because they can survive for a long time at high temperatures. Like the chamber material, the coating material is capable of transmitting light including a wavelength within the range of about 200 nanometers to about 800 nanometers.

Infrared selective mirror coatings comprising doped semiconductor oxides, called Drude mirror coatings, have been characterized with regard to electrical, optical, and material properties as discussed in T. Gerfin and M. Gratzel, "Optical properties of tin-doped indium oxide determined by spectroscopic ellipsometry", J. Appl. Phys., Vol. 79, pp. 1722–1729, Feb. 1, 1996. Drude mirror coatings have been used on glass panes of greenhouses to reduce energy losses caused by emission of infrared radiation while allowing sunlight to enter freely as described in S. D. Silverstein, "Effect of Infrared Transparency on the Heat Transfer Through Windows: A Clarification of the Greenhouse Effect", Science, Vol. 193, pp. 229–31, Jul. 16, 1976. Antimony-tin-oxide (ATO) films have been deposited by chemical vapor deposition on silicon oxide layers as described in T. P. Chow, M. Ghezzo, and B. J. Baliga, "Antimony-doped tin oxide films deposited by the oxidation of tetramethyltin and trimethylantimony", J. Electrochem. Soc., pp. 1040–45, May 1982, and it is therefore expected that ATO films can be deposited on quartz. Dichroic filters have been used in halogen-IR parabolic aluminum reflector (PAR) lamps available from the General Electric Company, Cleveland, Ohio, to reflect infrared radiant heat from the lamp envelope while allowing the visible radiation to be transmitted outside. The present invention differs from such halogen-IR PAR lamps wherein the light source is inside the coated chamber because, in the present invention, the light source is situated outside the coated chamber.

Lamp heating elements 18 may comprise ultraviolet (UV) discharge lamps such as mercury discharge lamps, metal halide visible discharge lamps, or halogen infrared incandescent lamps, for example. The wavelength range for the UV spectrum is from about 200 nanometers to about 400 nanometers, and the wavelength range for the visible spectrum is from about 400 nanometers to about 800 nanometers. Therefore, chamber 12 and coating 16 are preferably capable of passing light at a wavelength included in a range of about 200 nanometers to about 800 nanometers.

If the lamp heating elements are cylindrical, they can be lined up in parallel at a periodic distance from each other and at an equal distance from the semiconductor wafer. Lamp reflector 20 may comprise a group of concave mirrors 22 placed above the lamps to efficiently reflect the back illumination of the lamps.

Using a UV discharge lamp to process silicon wafers, for example, is expected to increase the light utilization efficiently by thirty percent or more over conventional tungsten lamp designs even without a coating on the chamber. The expected increase in efficiency is due to the fact that the silicon absorption spectrum has a larger overlap with the emission spectrum of the discharge lamp. Using the coating to provide heat recovery is expected to improve power efficiency by about an additional sixty-five percent. An overall improvement of about ninety-five percent is expected.

Figure 2:
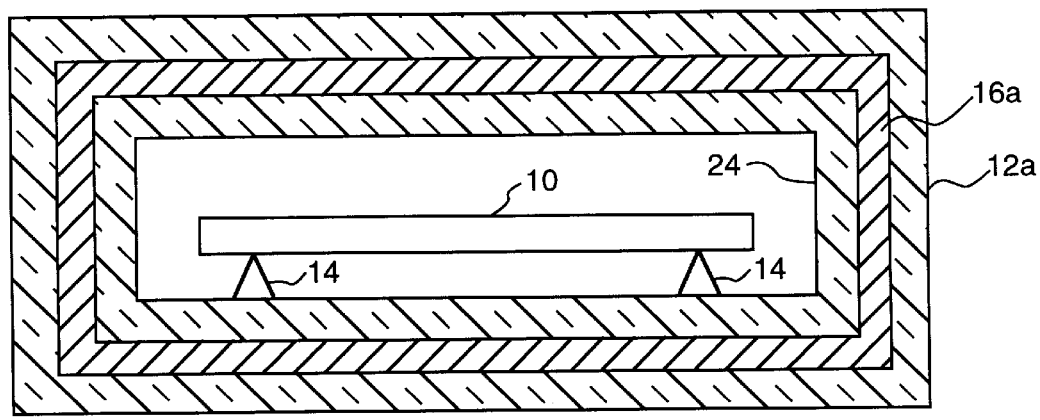
FIG. 2 is a view similar to that of FIG. 1 wherein a wavelength selective coating is situated on an inner chamber wall and covered by a passivation layer.

FIG. 2 is a view similar to that of FIG. 1 wherein a wavelength selective coating 16a is situated on the inner side of chamber wall 12a and covered by a passivation layer 24. Situating the coating on a wall inner side helps to reduce absorption of the IR radiation by the chamber wall 12a. The coating in this embodiment should be a refractory material that does not shed any particles onto the wafer and is free of contaminants. Passivation layer 24 may comprise a material such as, for example, silicon oxide ($SiO_2$) having a thickness in the range of about 0.1 microns to about 0.2 microns and can be added to coating 16a of FIG. 2 or coating 16 of FIG. 1 to protect the coating.

Figure 3:
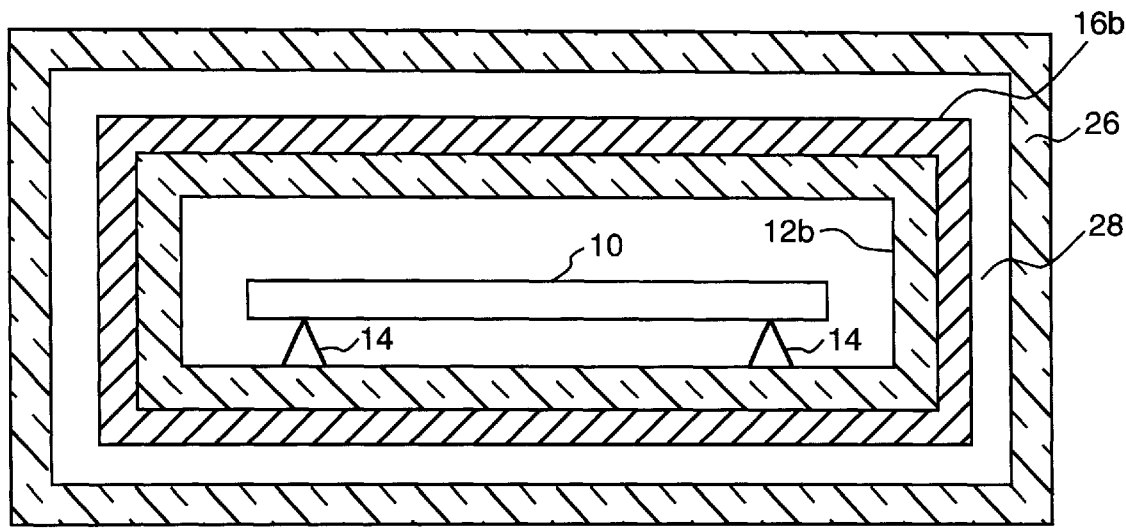
FIGS. 3–5 are views similar to that of FIG. 1 with a double-wall chamber.
Figure 4:
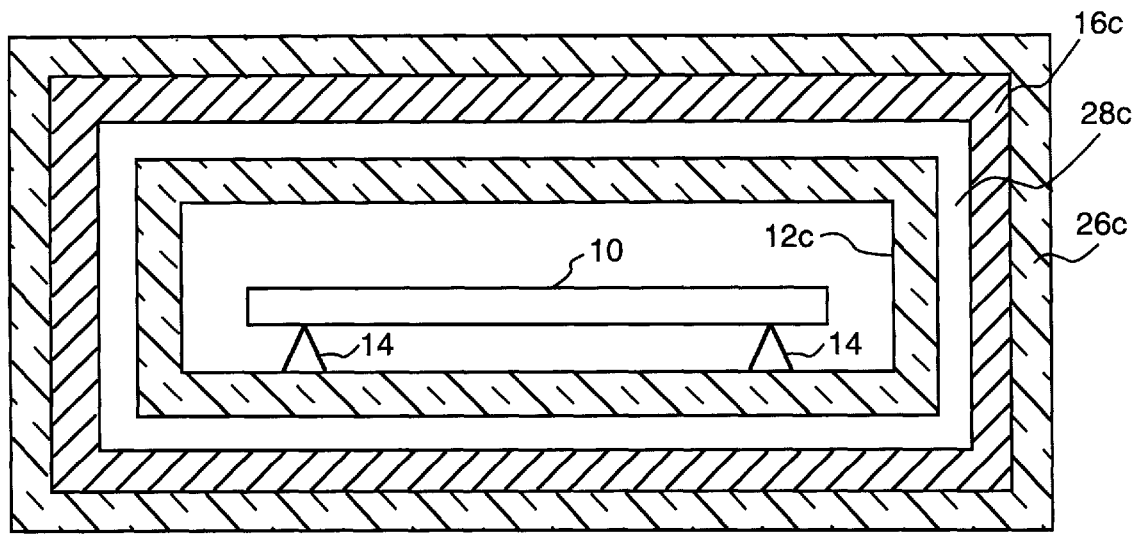
Figure 5:
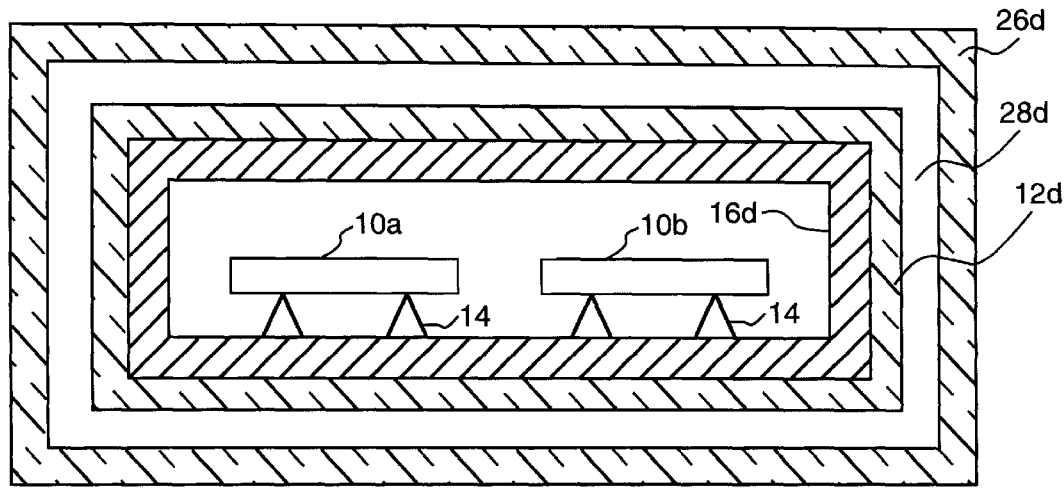

FIGS. 3–5 are views similar to that of FIG. 1 with a double-wall chamber for gas cooling which is useful if a single wall would result in the chamber wall temperature exceeding the thermal capability of the coating. This is useful because silicon wafers, for example, can reach temperatures exceeding 1000° C. In FIGS. 3 and 4, the coatings 16b and 16c, respectively, are positioned between chamber walls 12b and 26, and 12c and 26c, respectively. Forced air 28 and 28c can be pumped between chamber walls. In FIG. 3, coating 16b is situated on an outer surface of chamber wall 12b, and in FIG. 4, coating 16c is situated on an inner surface of chamber wall 26c. In FIG. 5, chamber walls 12d and 26d have forced air 28d pumped therebetween and coating 16d is present on an inner surface of chamber wall 12d. Furthermore, FIG. 5 illustrates a plurality of wafers 10a and 10b in a single chamber 12d.

Figure 6:
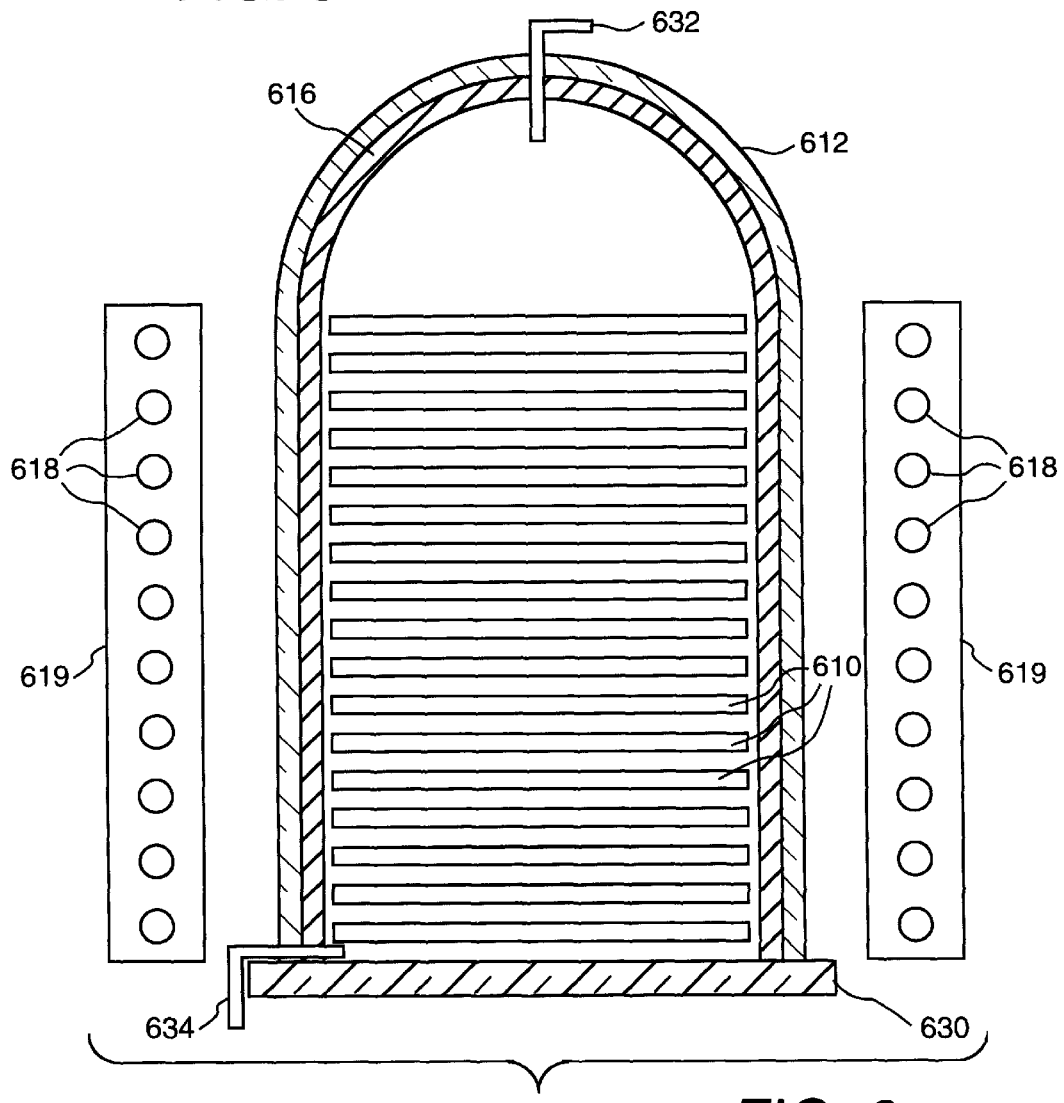
FIG. 6 is a sectional side view of a vertical thermal processor embodiment of the present invention.

FIG. 6 is a sectional side view of a vertical thermal processor embodiment 2 of the present invention wherein chamber 612 is coated with wavelength selective coating 616 and encloses a plurality of wafers 610 which can be stacked using quartz pins (not shown), for example. The chamber is sealed by cap 630 which may comprise a material such as quartz, for example. Gases such as $N_2$, $O_2$, or pyrogenic-generated steam can be supplied through gas inlet port 632 and released through gas outlet port 634. Radiant energy is supplied by lamp heating elements 618 of lamp assemblies 619.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A thermal processor for at least one semiconductor wafer comprising:

a reactor chamber for holding the at least one semiconductor wafer, the reactor chamber comprising a material substantially transparent to light including a wavelength within a range of about 200 nanometers to about 800 nanometers;

a coating on at least a portion of the reactor chamber, the coating comprising material substantially transparent to light including a wavelength within the range of about 200 nanometers to about 800 nanometers and substantially reflective of infrared radiation having a wavelength above about 800 nanometers; and a light source for providing radiant energy to the at least one semiconductor wafer through the coating and the reactor chamber.

2. The processor of claim 1, wherein the light source is an ultraviolet discharge lamp, a halogen infrared incandescent lamp, or a metal halide visible discharge lamp.

3. The processor of claim 1, wherein the reactor chamber is quartz, alumina doped quartz, alumina, or synthetic silica.

4. The processor of claim 1, wherein the coating is indium-tin-oxide, antimony-tin-oxide, fluorine-tin-oxide, undoped tin oxide, a dichroic filter, or a thin metal film.

5. The processor of claim 1, wherein the coating is situated on an outer surface of the reactor chamber.

6. The processor of claim 1, wherein the coating is situated on an inner surface of the reactor chamber.

7. The processor of claim 1, further including a passivation layer adjacent the coating.

8. The processor of claim 1, wherein the reactor chamber includes an inner wall and an outer wall.

9. The processor of claim 8, wherein the coating is situated between the inner and outer walls.

10. The processor of claim 9, wherein the coating is situated on the inner wall.

11. The processor of claim 9, wherein the coating is situated on the outer wall.

12. The processor of claim 8, wherein the coating is situated on an inner surface of the inner wall.

13. A thermal processor for at least one semiconductor wafer comprising:

a substantially transparent reactor chamber for holding the at least one semiconductor wafer;

a coating comprising a material substantially reflective of infrared radiation having a wavelength above about 800 nanometers and covering at least a portion of the reactor chamber, the combination of the reactor chamber and the coating being substantially transparent to light including a wavelength within the range of about 200 nanometers to about 800 nanometers; and an ultraviolet discharge lamp for providing radiant energy to the at least one semiconductor wafer through the coating and the reactor chamber.

14. The processor of claim 13, wherein the reactor chamber is quartz, alumina doped quartz, alumina, or synthetic silica and the coating is indium-tin-oxide, antimony-tin-oxide, fluorine-tin-oxide, undoped tin oxide, a dichroic filter, or a thin metal film.

15. An apparatus for use in a thermal processor, the apparatus comprising:

a reactor chamber for holding at least one semiconductor wafer, the reactor chamber comprising a material substantially transparent to light including a wavelength within a range of about 200 nanometers to about 800 nanometers; and a coating on at least a portion of the reactor chamber, the coating comprising material substantially transparent to light including a wavelength within the range of about 200 nanometers to about 800 nanometers and substantially reflective of infrared radiation having a wavelength above about 800 nanometers.

16. The apparatus of claim 15 wherein the reactor chamber is quartz, alumina doped quartz, alumina, or synthetic silica.

17. The apparatus of claim 16, wherein the coating is indium-tin-oxide, antimony-tin-oxide, fluorine-tin-oxide, undoped tin oxide, a dichroic filter, or a thin metal film.

18. The apparatus of claim 17, wherein the coating is situated on an outer surface of the reactor chamber.

19. The apparatus of claim 17, wherein the coating is situated on an inner surface of the reactor chamber.

20. The apparatus of claim 17, wherein the reactor chamber includes an inner wall and an outer wall.

21. The apparatus of claim 20, wherein the coating is situated between the inner and outer walls.

* * * * *